(12) United States Patent
Schinkel et al.

(10) Patent No.: US 12,308,796 B2
(45) Date of Patent: May 20, 2025

(54) BOOSTER STAGE CIRCUIT FOR POWER AMPLIFIER

(71) Applicant: AXIGN B.V., Enschede (NL)

(72) Inventors: Daniel Schinkel, Enschede (NL); Remko Van Heeswijk, Enschede (NL)

(73) Assignee: AXIGN B.V., Enschede (NL)

( * ) Notice: Subject to any disclaimer, the term of this patent is extended or adjusted under 35 U.S.C. 154(b) by 110 days.

(21) Appl. No.: 17/778,229

(22) PCT Filed: Oct. 26, 2020

(86) PCT No.: PCT/NL2020/050662
§ 371 (c)(1),
(2) Date: May 19, 2022

(87) PCT Pub. No.: WO2021/101371
PCT Pub. Date: May 27, 2021

(65) Prior Publication Data
US 2022/0416724 A1   Dec. 29, 2022

(30) Foreign Application Priority Data

Nov. 20, 2019   (NL) ..................................... 2024272

(51) Int. Cl.
*H03F 1/02*   (2006.01)
*H03F 3/00*   (2006.01)
*H03F 3/185*   (2006.01)
*H03F 3/217*   (2006.01)

(52) U.S. Cl.
CPC ........... *H03F 1/0238* (2013.01); *H03F 3/005* (2013.01); *H03F 3/185* (2013.01); *H03F 3/2173* (2013.01); *H03F 2200/03* (2013.01); *H03F 2200/171* (2013.01); *H03F 2200/462* (2013.01); *H03F 2200/471* (2013.01)

(58) Field of Classification Search
CPC ........ H03F 1/0238; H03F 3/005; H03F 3/185; H03F 3/2173; H03F 2200/03; H03F 2200/171; H03F 2200/462; H03F 2200/471; H03F 3/3061; H03F 1/303; H02M 3/07; H02M 3/155
USPC ............................. 330/297, 10, 251, 207 A
See application file for complete search history.

(56) References Cited

U.S. PATENT DOCUMENTS

| | | | |
|---|---|---|---|
| 8,212,620 B2 | 7/2012 | Strickland et al. | |
| 9,160,290 B2* | 10/2015 | Berkhout | H03F 3/2173 |
| 11,284,192 B2* | 3/2022 | Park | H02M 1/126 |
| 2018/0115246 A1 | 4/2018 | Azrai et al. | |

FOREIGN PATENT DOCUMENTS

| | | |
|---|---|---|
| GB | 2478170 A | 8/2011 |
| WO | 2017179974 A1 | 10/2017 |

OTHER PUBLICATIONS

International Search Report and Written Opinion for PCT Patent Application No. PCT/NL2020/050662 dated Jan. 26, 2021, 13 pages.

* cited by examiner

*Primary Examiner* — Hieu P Nguyen
(74) *Attorney, Agent, or Firm* — AEON Law, PLLC; Adam L.K. Philipp; Charlotte E. Holoubek

(57) ABSTRACT

The present invention is in the field of booster stage circuit for a power amplifier, and an external supply voltage power amplifier comprising said booster stage circuit, such as for amplifying an electronic signal to a speaker system. These amplifiers may be provided with an external supply voltage.

20 Claims, 5 Drawing Sheets

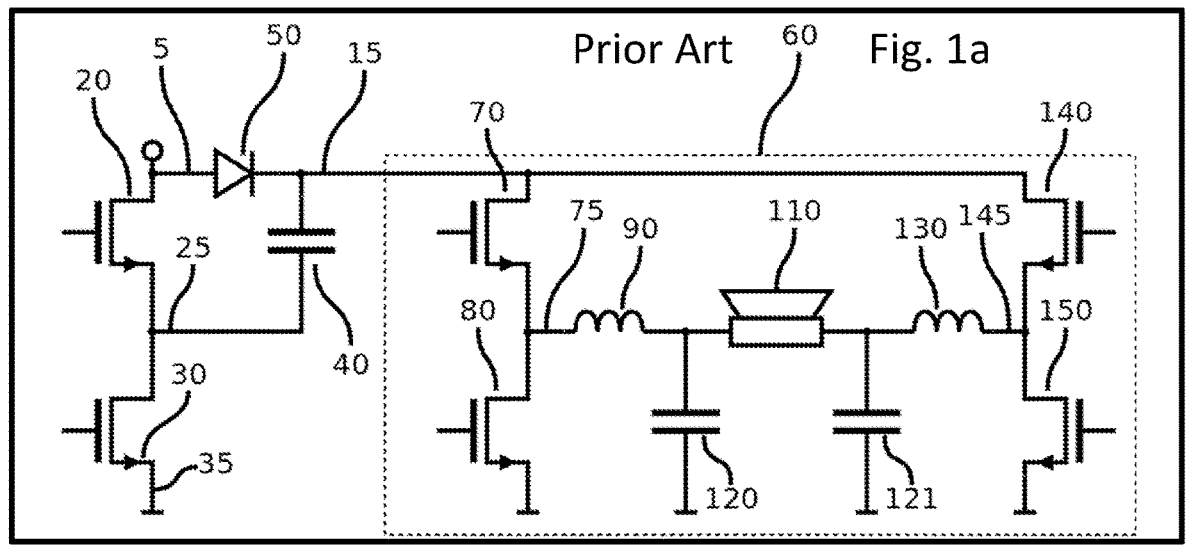
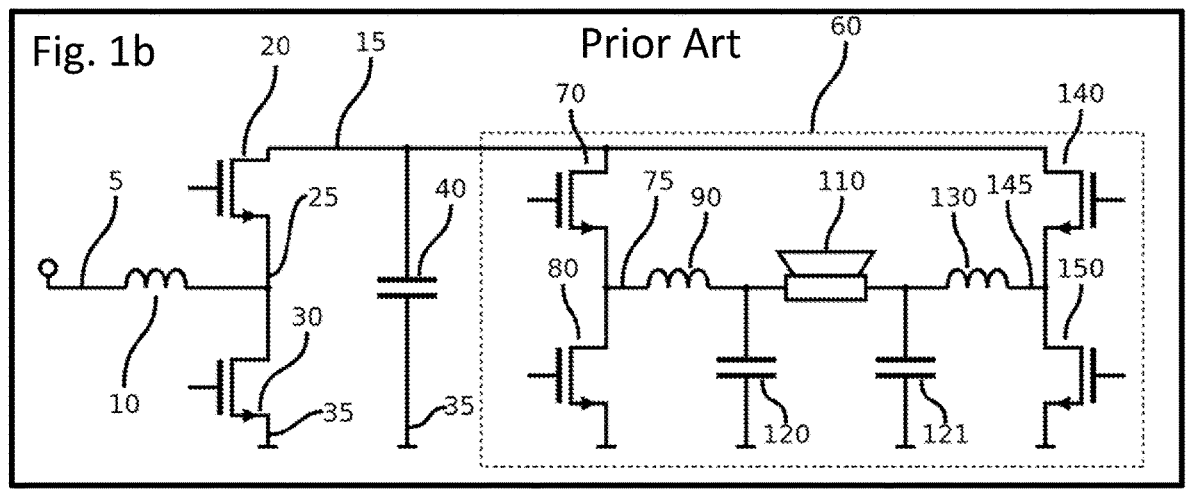
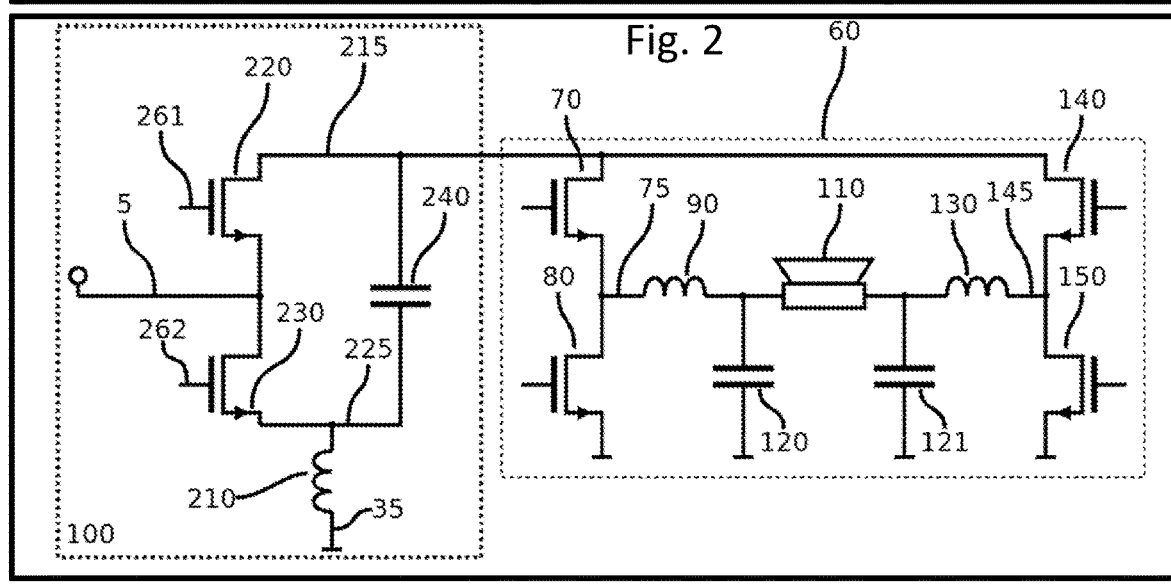

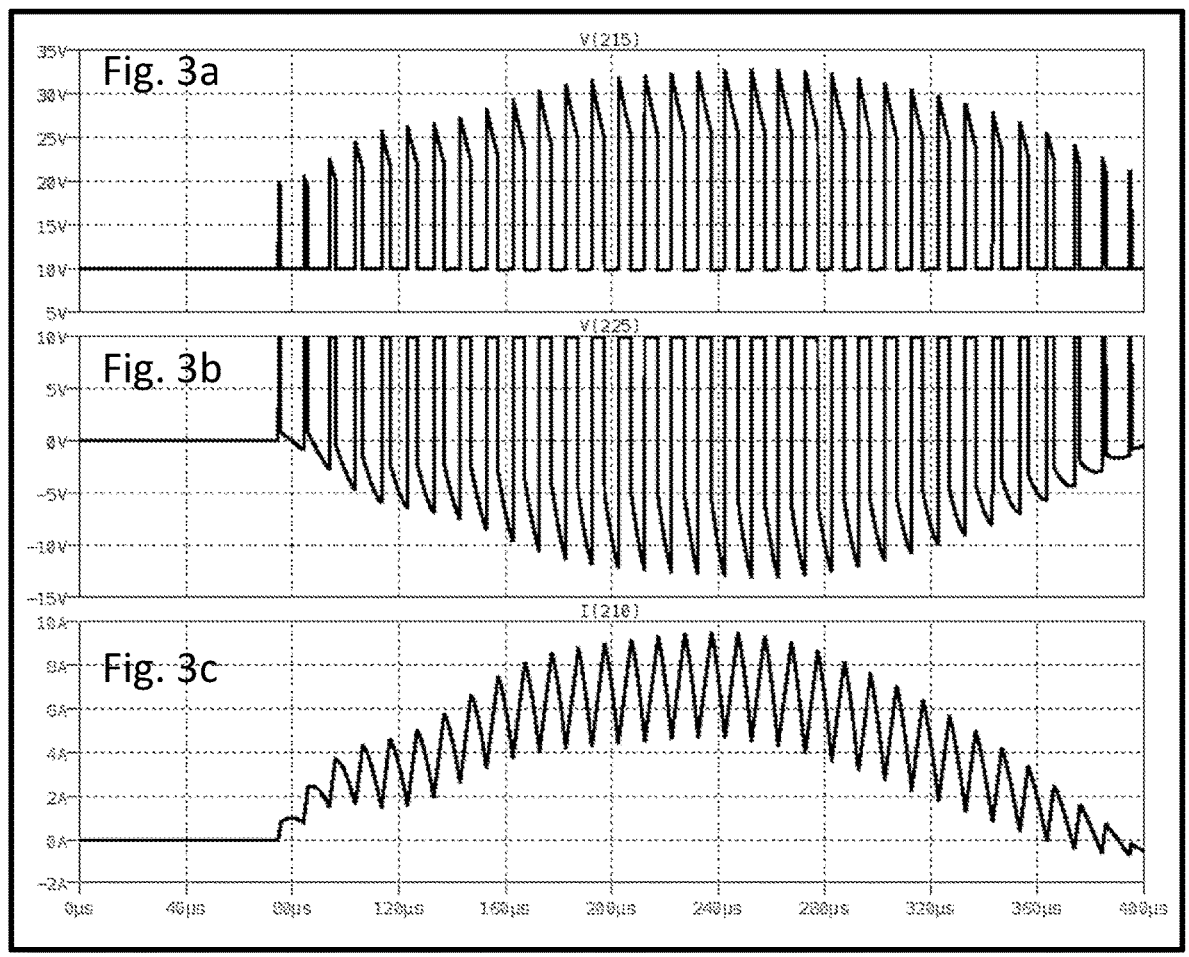
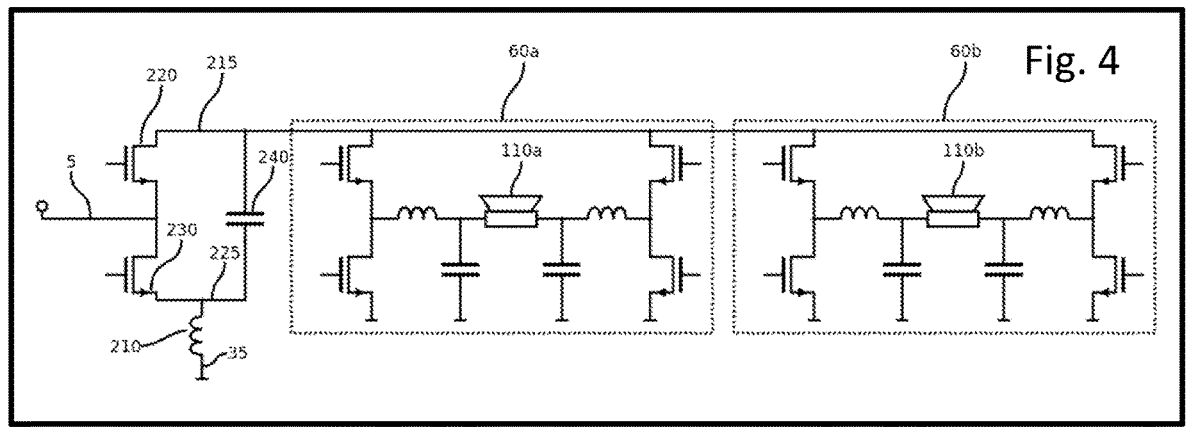

BOOSTER STAGE CIRCUIT FOR POWER AMPLIFIER

RELATED APPLICATIONS

This application is a U.S. National Phase of PCT Patent Application No. PCT/NL2020/050662 having International filing date of Oct. 26, 2020, which claims the benefit of priority of Netherlands Patent Application No. 2024272, filed Nov. 20, 2019, both in the name of "AXIGN B.V.". The entire contents of the above-referenced applications and of all priority documents referenced in the Application Data Sheet filed herewith are hereby incorporated by reference for all purposes.

FIELD OF THE INVENTION

The present invention is in the field of booster stage circuit for a power amplifier, and an external supply voltage power amplifier comprising said booster stage circuit, such as for amplifying an electronic signal to a speaker system (audio amplifier). These amplifiers may be provided with an external supply voltage.

BACKGROUND OF THE INVENTION

Prior art electronic amplifier circuits are often limited in the range of output voltages that they can provide by the supply voltage that they are provided with. For battery-operated devices this can be problematic when the battery voltage is not sufficiently high to deliver the desired output signals (under all circumstances). This is for example a problem in audio amplifiers which typically have output signals with peak signals that are many factors higher than the average signal power (so called high crest-factor).

To overcome this supply limitation, many amplifier circuit extensions have been proposed in the past that momentarily boost the available supply voltage beyond what is available from the external supply. Two approaches may be noted in particular: circuits that use a big storage capacitor (a 'flying capacitor') that can momentarily double the supply, such as in U.S. Pat. No. 8,212,620, which document shows an amplifier device including an amplifier having an input for receiving an audio input signal and an output for sending an output signal to a load, wherein a boosted-rail circuit is connected to a power source and has a single boosted rail connected to the BTL amplifier, such as shown in FIG. 1a and further circuits that use a separate switching power stage to generate the local supply, typically consisting of a booster circuit with an inductor and capacitor as shown in FIG. 1b. Both variants of the prior art that was discussed above still has problems. In case of the flying capacitor, a primary problem is that it discharges during use and can only achieve as a maximum a doubling of the supply. Also, when it is heavily discharged, re-charging will give power dissipation, such as in a diode being present. In case of the switching booster, a problem is that it takes time to charge the local supply 15 above the external supply 5. In more detail, this second problem entails the following: when a boost phase is desired, the inductor 10 first has to be charged by connecting it to ground 35 via the bottom transistor 30, which has a side-effect that the local supply 15 drops before it is boosted. This initial charging gives a momentary drop in the output before it starts to rise above the supply, and is a manifestation of the 'right-half-plane' zero that is a well-known problem in control of switching booster stages in general. In the application for the amplifier, it means that either some headroom is needed in the control of the supply (to give some margin for undesired supply variations), or some delay is needed in the processing of the input to be able to 'look ahead' and anticipate with the switching before the boost is actually needed. Another disadvantage of the switching booster in FIG. 1b is that the supply current always runs through the primary inductor 10, even when no boost is needed. The parasitic resistance of this inductor causes additional losses.

Incidentally US 2018/115246 A1 recites a system including a combination of a boost converter and a power converter coupled together in series, such that the series combination boosts an input voltage to the series combination to an output voltage greater than the input voltage such that a voltage boost provided by the series combination is greater than a voltage boost provided by the boost converter alone. The system may also include an amplifier, wherein an input of the amplifier is coupled to an output of the series combination of the boost converter and the power converter. The system is however relatively complex, and not very energy efficient.

It is an objective of the present invention to overcome disadvantages of the prior art booster circuits, and especially electrical and audio functioning thereof, without jeopardizing functionality and advantages.

SUMMARY OF THE INVENTION

The present invention relates in a first aspect to a booster stage circuit according to claim 1 for a power amplifier circuit for amplifying an input signal and generating an output signal, including a circuit to generate the supply rail voltage to the power amplifier. The supply voltage for the power amplifier is lifted by a flying capacitor when the output signal exceeds the voltage that is available from an external supply (e.g. a battery). The flying capacitor is automatically recharged with high efficiency after each lifting cycle through an inductor, also increasing the voltage across the flying capacitor to above the external supply. When boosting is needed, then the capacitor 240 is lifted and placed in series with the supply by switch-transistor 230. As such, an instantaneous doubling of the supply is available, without the charging delay present in the booster prior-art in FIG. 1b. When switch-transistor 230 closes, current will also start to build-up in the primary inductor 210. This inductor current will re-charge capacitor 240 when the circuit returns to the normal supply by opening 230 and closing 220. By alternating sufficiently fast between the normal supply 220 closed, 230 open and the boosted supply 220 open and 230 closed, a relatively small capacitance value 240 can be used while avoiding significant discharge, which is a marked advantage over the traditional flying capacitor supply doubler. On top of the above functionality, what also happens is that the average voltage on the flying capacitor increases, as a function of the duty cycle of the two switching phases. Also no degradation of power efficiency is provided as the capacitor is recharged with a high efficiency through the inductor 35 instead of through a dissipating diode 50 in the prior art of FIG. 1a. As with other booster circuits switching between modes can take place with variable, namely limited or full, energy transfer from the inductor to the capacitor.

So the present booster stage circuit is specifically suited for a power amplifier, and comprises an electrical connector 5 for an external power supply, at least one capacitor 240, the capacitor having a first side and a second side, the capacitor being electrically connected at a first side thereof to at least one first switch (220) and at a second side to at least one second switch (230) typically a single first switch 220 and/or a single second switch 230, wherein each individual switch is adapted to operate at a switching frequency of >20 kHz, wherein each individual switch with another side is adapted to be electrically connected to the electrical connector 5 note that the "switch side" could be on the capacitor side and on the electrical connector side, and wherein in a boost mode the at least one first switch 220 at one side of the capacitor is in an open status and the at least one second switch 230 at the other side of the capacitor is in an closed status, or wherein in a base mode the at least one first switch 220 at one side of the capacitor is in an closed status and the at least one second switch 230 at the other side of the capacitor is in an open status, at least one inductor 210 at one side electrically connected to (i) one side of the capacitor 240, and (ii) with at least one of the second switch 230, and at the other side (iii) with a ground, inputs 261 and 262 are adapted for receiving control input from a controller for operating the at least one first switch 220 and the at least one second switch 230, respectively, and optionally a controller for operating the at least one first and at least one second switch 220, 230. Were reference is made to "ground" also the lower input voltage of a supply can be referred to. In between boost mode and base mode the switches 220, 230 may both be open, which may be referred to as a dead zone mode, in order to prevent shorts.

In a second aspect the present invention relates to an external supply voltage power amplifier 60 comprising at least one booster stage circuit according to any of claims 1-8, wherein the power amplifier is selected from an audio amplifier, a hearing aid amplifier, an electric motor control amplifier, a variable power supply unit, a time varying power supply, and combinations thereof.

Applications are especially those amplifiers that have a fixed supply voltage, either because they are battery powered (including automotive amplifiers) or because the supply-unit is fixed. A primary application is audio amplifiers. However, the concept is easily extended to other fields, e.g. electric motor control, variable power supply units, or any other field where time-varying power-signal are desired.

Thereby the present invention provides a solution to one or more of the above mentioned problems.

Advantages of the present description are detailed throughout the description.

DETAILED DESCRIPTION OF THE INVENTION

The present invention relates in a first aspect to a booster stage circuit according to claim 1.

In an exemplary embodiment of the present booster stage circuit the at least one first and at least one second switch 220, 230 may each individually be selected from a transistor, such as an NMOS transistor, a PMOS transistor, a bipolar transistor, a FET, such as a GaN FET, an IGBT, and combinations thereof.

In an exemplary embodiment of the present booster stage circuit the at least one capacitor 240 may each be individually selected from a ceramic capacitor, a fill capacitor, an electrolytic capacitor, a non-polarized capacitor, a multilayer capacitor, with a capacitance of 10 pF-10000 µF, preferably 50 pF-100 µF, more preferably 100 pF-50 µF, even more preferably 1 nF-5 µF, such as 100 nF-1 µF, and combinations thereof. For a high power application a larger capacitance is preferred.

In an exemplary embodiment of the present booster stage circuit the at least one inductor 210 may each individually be selected from an air-core inductor, a ferro-magnetic-core inductor, a variable inductor, a choke, a solenoid, with an inductance of 10 nH-20 H, preferably 0.1 µH-10 H, more preferably 1 µH-1 H, such as 100 µH-0.01 H, and combinations thereof.

In an exemplary embodiment of the present booster stage circuit each individual switch may be adapted to operate at a switching frequency of 50 kHz-2.4 GHz, preferably 100 kHz-1.2 GHz, such as 250 kHz-30 MHz.

In an exemplary embodiment the present booster stage circuit may further comprise a feedback loop details thereof, preferably wherein the feedback loop comprises a feedback filter.

In an exemplary embodiment the present booster stage circuit may further comprise a clock, wherein the clock is adapted to provide a clock frequency of >50 kHz, preferably 100 kHz-10 GHz, more preferably 300 kHz-2.4 GHz, such as 500 kHz-1.2 GHz.

In an exemplary embodiment the present booster stage circuit may further comprise a rectifier parallel to the at least one switch 220, 230, such as a diode, or a second capacitor parallel to the first capacitor and a third switch in between the first and second capacitor, and combinations thereof.

The invention although described in detailed explanatory context may be best understood in conjunction with the accompanying examples and figures.

SUMMARY OF FIGURES

FIGS. 1a-b, 2-3, 3a-c, and 4-11 show details of booster circuits.

BRIEF DESCRIPTION OF FIGURES

FIG. 1a shows prior art circuits that use a big storage capacitor (a 'flying capacitor') that can momentarily double the supply.

FIG. 1b shows prior art circuits that use a separate switching power stage to generate the local supply.

FIG. 2 shows a present circuit which can be considered as a combination of the flying-capacitor supply doubler (augmenting the supply with the voltage stored on the capacitor) and a switching booster.

FIGS. 3a-c show an example of voltage and current waveforms involved.

FIG. 4 shows that the boost stage can be loaded with two amplifiers in parallel.

Figure 5:
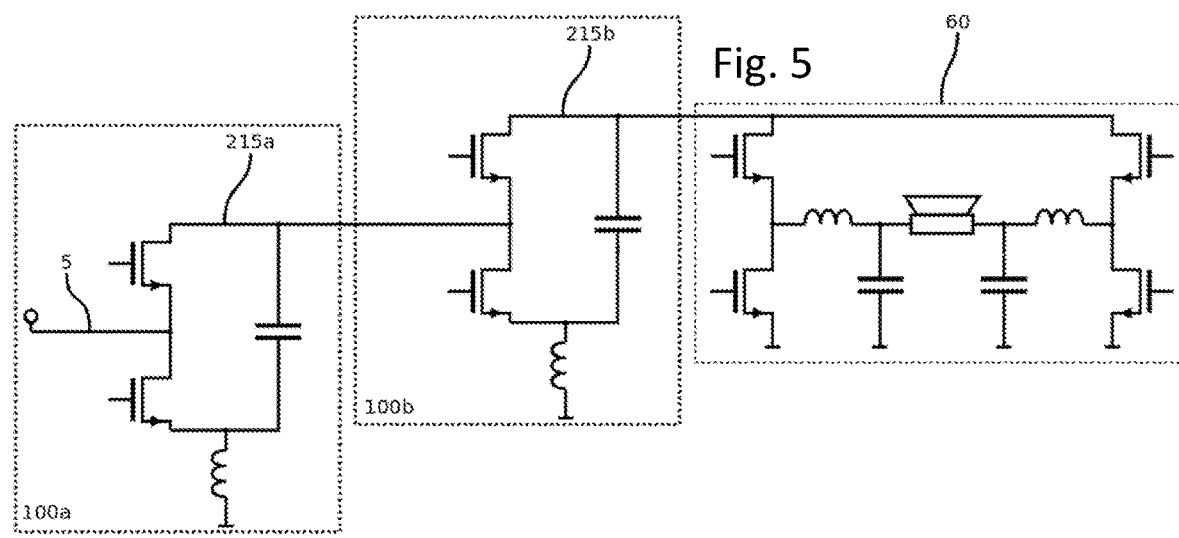

FIG. 5 shows another embodiment, with cascaded multiple booster stages.

Figure 6:
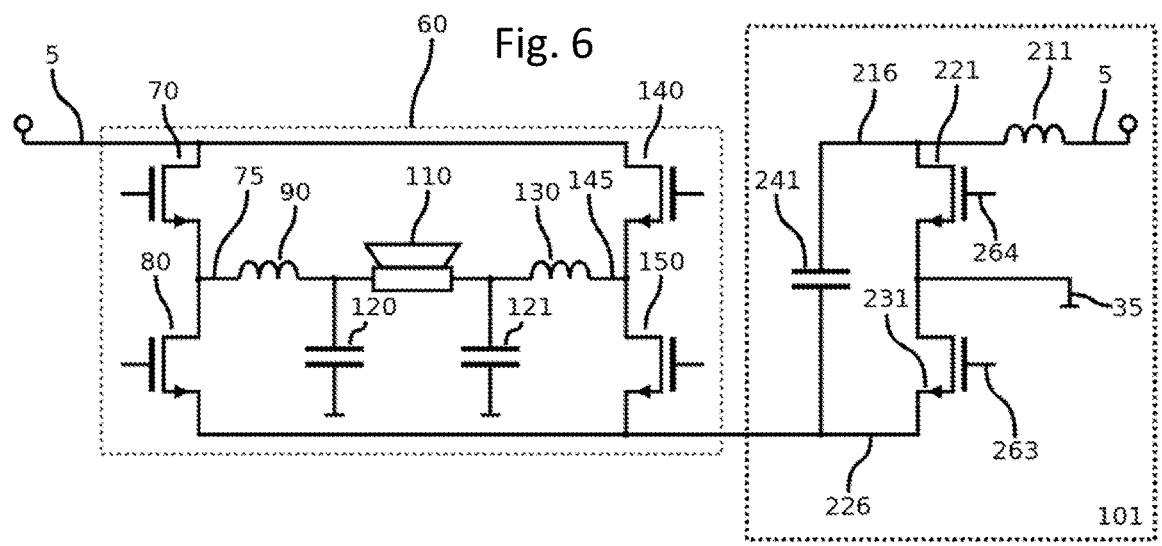

FIG. 6 shows yet another embodiment of the booster stage.

Figure 7:
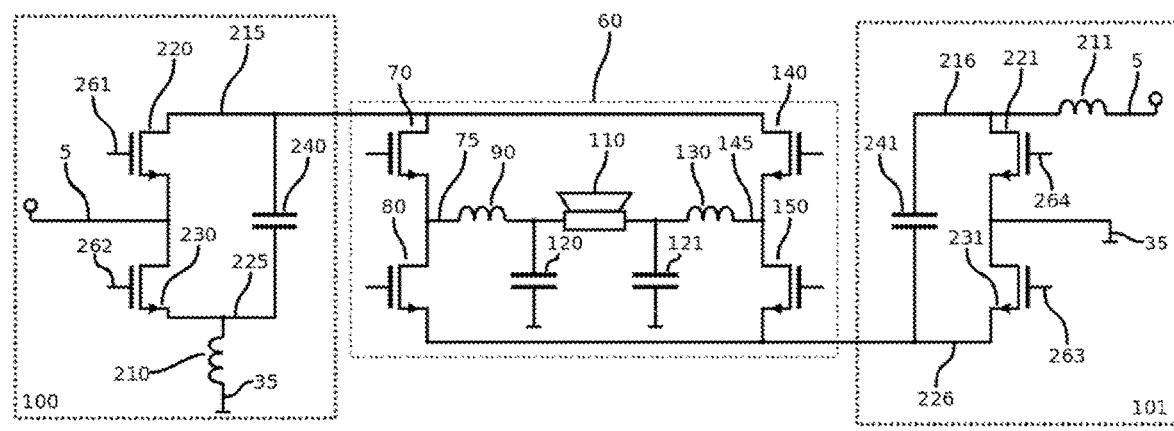

FIG. 7 shows an embodiment with a combination of high-side booster and low-side booster.

Figure 8:
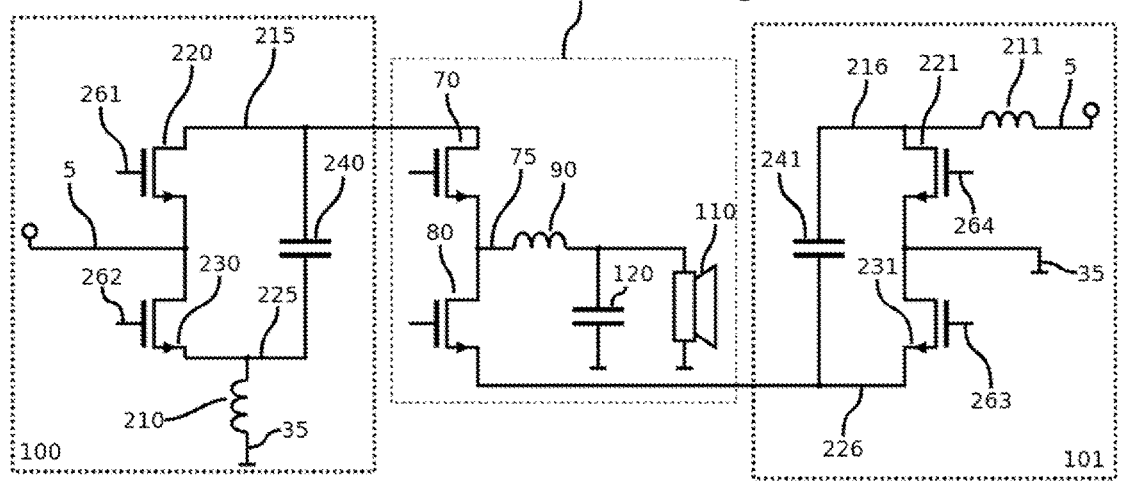

FIG. 8 shows a single-ended amplifier.

Figure 9:
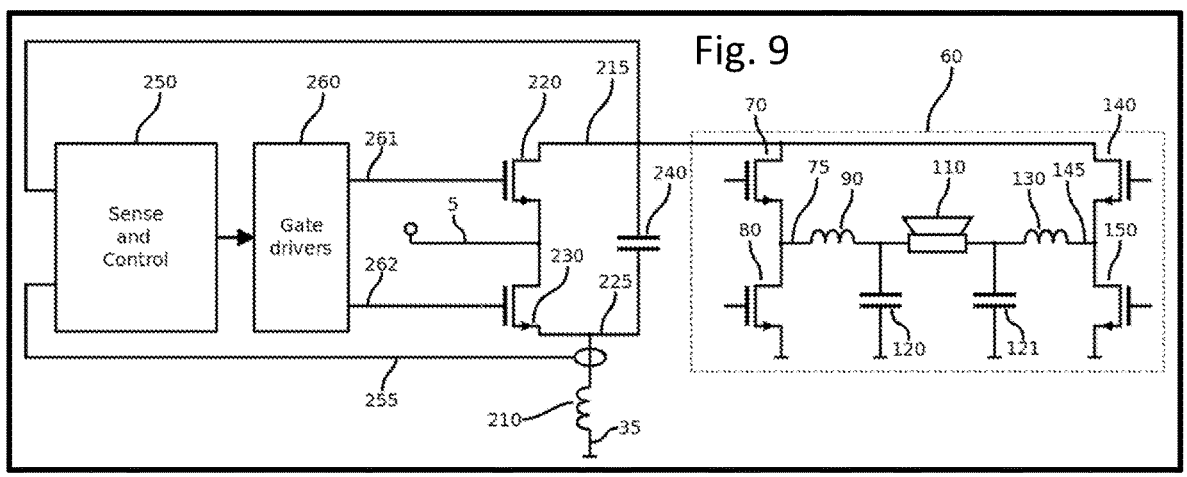

FIG. 9 shows an example wherein for better control over output signals, output voltage and/or current can be sensed and fed back to a controller.

Figure 10:
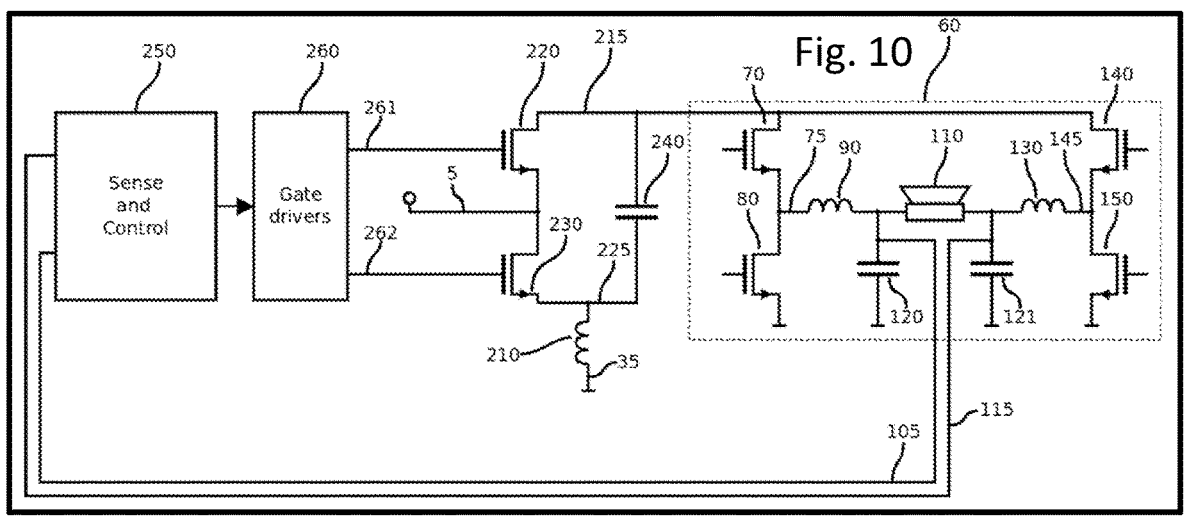

FIG. 10 shows another option, which is to sense the output voltages of the amplifier and use those signals as indirect indication of the rail voltage.

Figure 11:
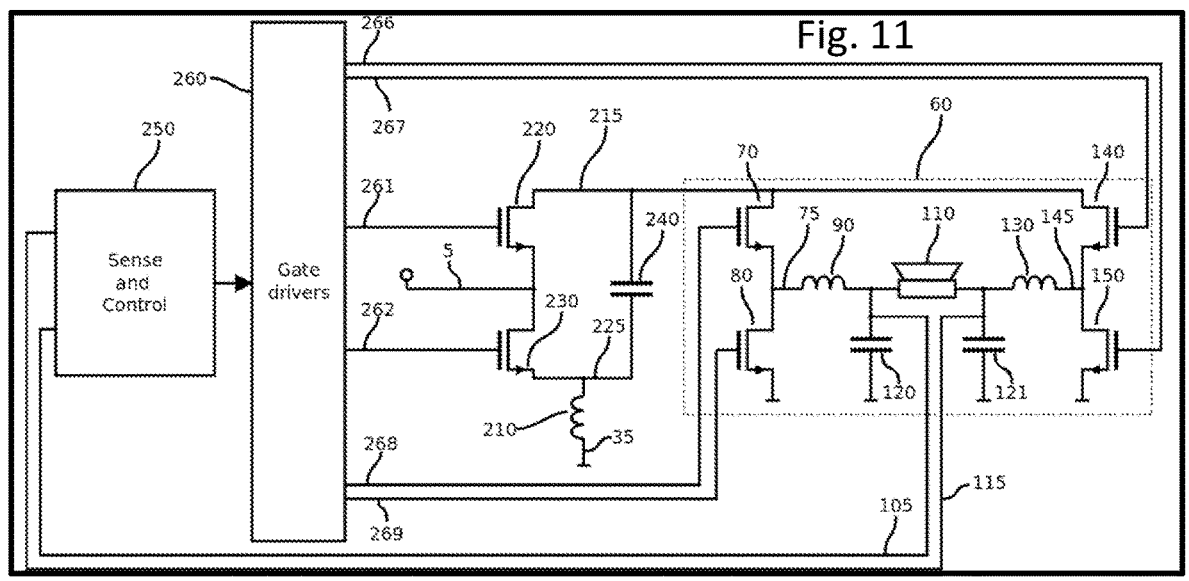

FIG. 11 shows an embodiment wherein the controller controls both the booster stage as well as the amplifier signals itself.

DETAILED DESCRIPTION OF FIGURES

The figures are of an exemplary nature. Elements of the figures may be combined.

In the figures:
- 100a,b Booster circuit
- 5 electrical connector to a supply
- 10 inductor
- 15 electrical connector
- 20 first switch
- 25 electrical connector
- 30 second switch
- 35 electrical connector to return of the supply or ground
- 40 capacitor
- 50 rectifier, such as diode
- 60 audio amplifier
- 70 third switch
- 75 electrical connector
- 80 fourth switch
- 90 inductor
- 105 electrical connector
- 115 electrical connector
- 110 speaker
- 120 capacitor
- 121 capacitor
- 130 inductor
- 140 fifth switch
- 145 electrical connector
- 150 sixth switch
- 210 inductor
- 215 electrical connector
- 215a electrical connector
- 215b electrical connector
- 220 first switch
- 225 electrical connector
- 230 second switch
- 240 capacitor
- 250 control circuit
- 255 inductor current sense connector
- 260 gate driver circuit
- 261 electrical connector
- 262 electrical connector
- 266 electrical connector
- 267 electrical connector
- 268 electrical connector
- 269 electrical connector FIG. 1a shows prior art circuits that use a big storage capacitor (a 'flying capacitor') that can momentarily double the supply, as shown in FIG. 1a (with various embodiments conceivable).

FIG. 1b shows prior art circuits that use a separate switching power stage to generate the local supply, typically consisting of a booster circuit with an inductor 10 and capacitor 40. The control and transistors for such an amplifier are for example present in Texas Instruments TAS2563.

FIG. 2 shows a present circuit which can be considered as a combination of the flying-capacitor supply doubler (augmenting the supply with the voltage stored on the capacitor) and a switching booster, overcoming the above drawbacks. During normal operation, in the base mode, such as when no boosting is needed, the local supply 215 is directly connected to the external supply 5, with only a switch-transistor 220 in between, so there is no additional dissipation in a supply inductor. During this operation, the voltage across the flying capacitor 240 becomes equal to the supply 5 because its bottom plate is discharged to ground 35 via the inductor 210.

When boosting is needed, then the capacitor 240 is lifted and placed in series with the supply by switch-transistor 230. As such, an instantaneous doubling of the supply is available, without the charging delay present in the booster prior-art in FIG. 1b. When switch-transistor 230 closes, current will also start to build-up in the primary inductor 210. This inductor current will re-charge capacitor 240 when the circuit returns to the normal supply by opening 230 and closing 220. By alternating sufficiently fast between the normal supply 220 closed, 230 open) and the boosted supply (220 open and 230 closed), a relatively small capacitance value 240 can be used while avoiding significant discharge, which is a marked advantage over the traditional flying capacitor supply doubler (prior art of FIG. 1a).

On top of the above functionality, what also occurs is that the average voltage on the flying capacitor increases, as a function of the duty cycle of the two switching phases, following similar relations as other switching converters. An example of the voltage and current waveforms involved are shown in FIGS. 3a-c.

Various extensions of the concept are possible. First of all, the boost stage can be loaded with multiple amplifiers in parallel, with an example with two amplifiers (60a and 60b) shown in FIG. 4. A similar technique can be used with a conventional booster from FIG. 1b, but with the conventional booster, all amplifiers will automatically use the higher supply even if their output does not require a higher supply, leading to more power consumption. In the proposed topology of FIG. 4, the rail-voltage on 215 is at the normal supply during part of the cycle and at the boosted voltage during another. Switching schemes can be arranged such that any amplifier that only needs to produce small output voltages can switch its transistors to the rail 215 when that rail is at the normal supply, while those amplifiers that need higher output voltage use the rail 215 when it is boosted.

Control of the Boosted Stage

The signals that control the behavior of the switches in the booster 220 & 230 can be derived based on an input signal with pulse-width modulation techniques, possibly with compensation of the non-linear pulse-width to voltage relation, similar to what is for example done for a conventional boost circuit. As is customary in switching power converters, for better control over the output signals, the output voltage 215 and/or the current in the inductor 255 can be sensed and fed back to the controller 250, as is shown in FIG. 9. For the voltage and/or current-sensing, any of the various methods known in the field of power conversion for can be applied. The controller 250 itself can be an analog circuit or a digital controller. A digital controller, e.g. the one described in [WO2017/179974], first digitizes the sensed signals with analog to digital converters and subsequently uses digital control algorithms to create the pulse-width modulated (PWM) signals. Regardless of the method of control, once the PWM signals are created they need to be converted to the proper voltage levels to control the switches, which is usually done in a so-called Gate driver circuit 260.

Another option is to cascade multiple booster stages, as shown in FIG. 5. In such a cascade, the output (215a) of the first booster stage (100a) is connected to the supply input of the second booster stage (100b), which in turn creates the local supply (215b) for the amplifier. Which such a cascade, higher boosting factors are easier to achieve than with a single boosting stage. When the boost mode of the two stages is done simultaneous, then the external supply can be tripled at the onset of the boosting mode, with higher boosting factors possible once the capacitors are charged to higher values. Alternatively, when the boosting and base mode of the two stages are alternated, then the amplifier supply (215b) can get a boosted supply for a longer percentage of the time.

Another embodiment of the booster stage is shown in FIG. 6. This embodiment (101) is the inverting, negative side equivalent of the supply-booster (100). Instead of lifting the supply, the flying capacitor (241) is now used to boost the low side of the amplifier supply (226). In base mode, switch (231) connects the low side of the amplifier (226) to ground (35). In boost mode, switch (231) opens and switch (221) closes, pushing the low side (226) below ground with a voltage equal to the stored voltage on capacitor (241), while simultaneously charging the capacitor (241) via inductor (211) which is connected to the external supply (5).

A combination of the high-side booster (100) and a low-side booster (101) leads to the embodiment shown in FIG. 7. This embodiment enables boosting of both sides of the supply of the amplifier (60) which not only enables larger boosting factors, but also enables a more balanced behavior, in the sense that the voltages at both ends of the load (110) can change in opposing directions, also during boost modes. Such balanced or differential behavior can reduce the electromagnetic interference (EMI) generated by the amplifier.

Another amplifier embodiment that is enabled by the combination of a high-side and low-side booster from FIG. 7 is a single-ended amplifier, as shown in FIG. 8. The single-ended amplifier (61) normally requires a positive and a negative supply voltage to be able to generate positive and negative output voltages. With the low-side booster stage (101), the negative supply voltages (226) can be created on demand. The high-side booster stage (100) also enables positive output voltages above the external supply (5). It would also be possible to omit the high-side booster (100) and connect the amplifier supply (215) directly to the external supply (5), but then the highest positive voltage on the load would be limited by the supply.

Further combinations of the various embodiments are of course also possible, such as the use of a cascade of boosters (as in FIG. 5) in a symmetric configuration (as in FIG. 7 or FIG. 8), or the use of multiple amplifiers (as in FIG. 4) in a symmetric configuration.

Another option is to sense the output voltages of the amplifier as shown in FIG. 10 and use those signals 105 and 115 as an indirect indication of the rail voltage.

Even better results can be achieved when the same controller controls both the booster stage as well as the amplifier signals itself, as shown in FIG. 11, because such a controller knows when the booster stage is active and with which duty cycle, to which it can adapt the pulse-widths send to the switching amplifier. To further enhance its behavior, such a controller might not only sense the output voltage 105 and 115 but possibly also the rail voltage 215 and/or the current through the inductor (signal 255 in FIG. 9).

The invention claimed is:

1. A booster stage circuit for a power amplifier comprising an electrical connector for an external power supply, at least one capacitor, the capacitor having a first side and a second side, the capacitor being electrically connected at the first side thereof to a first side of at least one first switch and at the second side thereof to a first side of at least one second switch, wherein each of the at least one first switch and each of the at least one second switch is adapted to operate at a switching frequency of >20 kHz, wherein each individual switch of the at least one first switch and of the at least one second switch with a second side of the respective switch is adapted to be electrically connected to the electrical connector, and wherein in a boost mode the at least one first switch is in an open status and the at least one second switch is in an closed status, and wherein in a base mode the at least one first switch is in an closed status and the at least one second switch is in an open status, at least one inductor at one side electrically connected to (i) the second side of the capacitor, and (ii) with the first side of the at least one of the second switch, and at the other side (iii) connected with a ground, wherein the at least one inductor has an inductance of 1 µH-20 H, and inputs are adapted for receiving control input from a controller for operating the at least one first switch and the at least one second switch, respectively.

2. The booster stage circuit according to claim 1, wherein the at least one first and at least one second switch are each individually selected from a transistor, and an IGBT.

3. The booster stage circuit according claim 1, wherein the at least one capacitor is each individually selected from a ceramic capacitor, a fill capacitor, an electrolytic capacitor, a non-polarized capacitor, a multilayer capacitor, with a capacitance of 10 pF-10000 µF, and combinations thereof.

4. The booster stage circuit according claim 1, wherein the at least one inductor is each individually selected from an air-core inductor, a ferro-magnetic-core inductor, a variable inductor, a choke, a solenoid, and combinations thereof.

5. The booster stage circuit according claim 1, wherein each individual switch of the at least one first switch and of the at least one second switch is adapted to operate at a switching frequency of 50 kHz-2.4 GHz.

6. The booster stage circuit according to claim 1, further comprising a clock, wherein the clock is adapted to provide a clock frequency of >50 KHz.

7. The booster stage circuit according to claim 1, further comprising a rectifier selected from a rectifier parallel to the at least one first switch, and a rectifier parallel to the at least one second switch.

8. An external supply voltage power amplifier comprising at least one booster stage circuit according claim 1, wherein the power amplifier is selected from an audio amplifier, a hearing aid amplifier, an electric motor control amplifier, a variable power supply unit, and a time varying power supply.

9. The booster stage circuit according to claim 1, wherein the first side of the least one capacitor is directly electrically connected to the first side of the at least one first switch, and the second side of the at least one capacitor is directly connected to a first side of the at least one second switch.

10. The booster stage circuit according to claim 1, wherein one of
the first side of the least one capacitor is directly electrically connected to the first side of the at least one first switch, and
the second side of the at least one capacitor is directly connected to a first side of the at least one second switch.

11. A booster stage circuit for a power amplifier comprising:
an electrical connector for an external power supply;
at least one capacitor, the capacitor having a first side and a second side, the capacitor being electrically connected at the first side thereof to a first side of at least one first switch and at the second side thereof to a first side of at least one second switch, wherein each of the at least one first switch and each of the at least one second switch is adapted to operate at a switching frequency of >20 kHz, wherein each individual switch of the at least one first switch and of the at least one second switch with a second side of the respective switch is adapted to be electrically connected to the electrical connector, and wherein in a boost mode the at least one first switch is in an open status and the at least one second switch is in an closed status, and wherein in a base mode the at least one first switch is in an closed status and the at least one second switch is in an open status;

at least one inductor at one side electrically connected to (i) the second side of the capacitor, and (ii) with the first side of the at least one of the second switch, and at the other side (iii) connected with a ground, wherein the at least one inductor has an inductance of 1 µH-20 H;

inputs being adapted for receiving control input from a controller for operating the at least one first switch and the at least one second switch, respectively; and a feedback loop.

12. The booster stage circuit according to claim 11, wherein the at least one first and at least one second switch are each individually selected from a transistor, and an IGBT.

13. The booster stage circuit according claim 11, wherein the at least one capacitor is each individually selected from a ceramic capacitor, a fill capacitor, an electrolytic capacitor, a non-polarized capacitor, a multilayer capacitor, with a capacitance of 10 pF-10000 µF, and combinations thereof.

14. The booster stage circuit according claim 11, wherein the at least one inductor is each individually selected from an air-core inductor, a ferro-magnetic-core inductor, a variable inductor, a choke, a solenoid, and combinations thereof.

15. The booster stage circuit according claim 11, wherein each individual switch of the at least one first switch and of the at least one second switch is adapted to operate at a switching frequency of 50 kHz-2.4 GHz.

16. The booster stage circuit according claim 11, further comprising a clock, wherein the clock is adapted to provide a clock frequency of >50 kHz.

17. The booster stage circuit according claim 11, further comprising a rectifier selected from a rectifier parallel to the at least one first switch, and a rectifier parallel to the at least one second switch.

18. An external supply voltage power amplifier comprising at least one booster stage circuit according claim 11, wherein the power amplifier is selected from an audio amplifier, a hearing aid amplifier, an electric motor control amplifier, a variable power supply unit, and a time varying power supply.

19. The booster stage circuit according to claim 11, wherein the first side of the least one capacitor is directly electrically connected to the first side of the at least one first switch, and the second side of the at least one capacitor is directly connected to a first side of the at least one second switch.

20. The booster stage circuit according to claim 11, wherein one of
the first side of the least one capacitor is directly electrically connected to the first side of the at least one first switch, and
the second side of the at least one capacitor is directly connected to a first side of the at least one second switch.

* * * * *